United States Patent [19]
Adams et al.

[11] Patent Number: 5,764,167
[45] Date of Patent: Jun. 9, 1998

[54] COMPRESSION AND DECOMPRESSION OF RUNS OF ONES AND ZEROS IN GROUPS THAT PROGRESSIVELY INCREASE IN SIZE WITHIN EACH RUN

[75] Inventors: Paul Stuart Adams, Eastleigh; Benedict Daniel Gladwyn, Winchester; Simon Phipps, Southampton; Vince Singleton, Daventry, all of United Kingdom

[73] Assignee: International Business Machines Corporation, Armonk, N.Y.

[21] Appl. No.: 652,068

[22] Filed: May 23, 1996

[51] Int. Cl.$^6$ .................................................. H03M 7/46
[52] U.S. Cl. ........................................................ 341/63
[58] Field of Search ........................................ 341/63, 64

[56] References Cited

U.S. PATENT DOCUMENTS 4,988,998  1/1991  O'Brien .................................. 341/87

Primary Examiner—Howard L. Williams
Attorney, Agent, or Firm—Ronald L. Drumheller

[57] ABSTRACT

In system and method for data compression and decompression, runs of the same bit value are identified within the data to be compressed and decompressed into a series of groups of bits wherein the number of bits in each group progressively increases as compared to the preceding groups until all of the bits of the run can be represented.

10 Claims, 4 Drawing Sheets

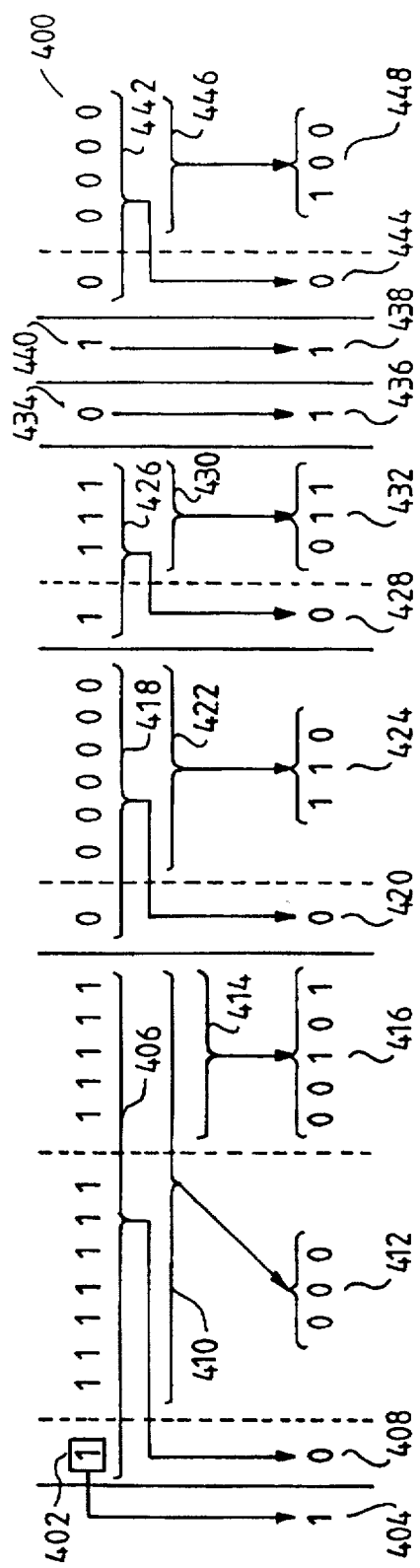
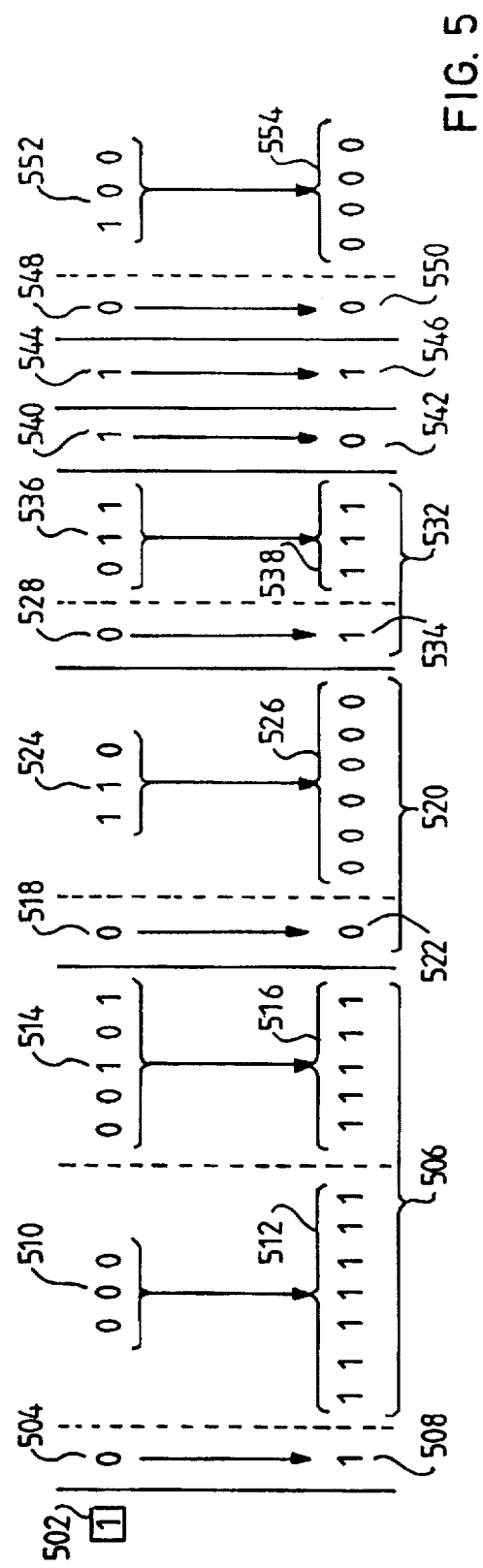
FIG. 4
FIG. 5

COMPRESSION AND DECOMPRESSION OF RUNS OF ONES AND ZEROS IN GROUPS THAT PROGRESSIVELY INCREASE IN SIZE WITHIN EACH RUN

BACKGROUND OF THE INVENTION

1. Field of the Invention

The present invention relates to a system and method of compressing and decompressing data.

2. Related Art

In order to be able to efficiently store or transmit, for example, a sequence of digital images it is desirable to compress the sequence such that the amount of data constituting the compressed sequence is less than that constituting the original sequence. It is further desirable to be able to recover the original sequence from the compressed sequence.

Such compression can be utilized in, for example, video conferencing systems, video telephones or collaborative working systems. The users of such systems communicate both aurally and visually. The ability to see the other party gives a more natural and interactive quality to the communication and allows the parties to more confidently evaluate their counter-part. In such systems there is a need to exchange large amounts of data to keep the displayed images of the parties updated. Further, a sequence of compressed digital images requires less bandwidth to transmit as compared to a sequence of complete digital images.

Digital image compression also finds application in storing image data on mass storage media, such as CD-ROMS or magnetic storage media, to reduce the amount of storage space required to record a sequence of digital images.

Many compression and decompression methods use run length encoding, such as techniques are described in, for example, "Data Compression Techniques and Applications, Hardware and Software Considerations", by Gilbert Held, published by John Wiley & Son, second edition. A special character and a number are used within the data to be compressed to indicate the beginning of a compressed run and the number of data units constituting the compressed run respectively. However, the use of such a special character is not appropriate within the context of processing data comprising only binary digits.

U.S. Pat. No. 5,298,992 discloses a method for coding a plurality of compressed video streams in a time ordered sequence. Each compressed data stream includes coding of frame to frame differences of a video segment, which are represented as a compressed M×N exclusive-or plane of pixel change values and location displacement control values for an output pointer into a decompressed video frame. U.S. Pat. No. 5,298,992 operates on a per byte basis which is not necessarily desirable when attempting to compress images in which the data thereof is represented on a bit-by-bit basis.

SUMMARY

Accordingly the present invention provides a method for compressing a sequence of bits having runs of ones and runs of zeros, said method comprising the steps of outputting the value of the first bit of said sequence, and establishing the initial length of a run and setting an indicator comprising at least one bit to an initial value, repeatedly determining whether or not the current length of said run can be represented using the current number of bits of said indicator, and if not, reducing the current length of said run by the maximum number which can be represented using said current number of bits and increasing said current number of bits, and producing, in response to a determination that the current length of said can be represented using the current number of bits of said indicator, an output comprising an indication of (i) said initial length of said run less said current length of said run, and (ii) the number of bits in the current length of said run using said current number of bits.

Compression and decompression as described herein can be effected using any data set in which runs of bits of zeros or bits of ones occur and is not limited to processing digital image data. The sequence of data units or data set to be compressed can represent, for example, the digital images used in a video conferencing system or a data or program file stored on a magnetic storage medium.

Compression and decompression according to the present invention is very fast and simple to implement. It finds particular application, when processing monochrome digital images which are represented on a bit-by bit basis and also as a second stage of compression; the first stage being a comparison or an exclusive-or operation effected between monochrome images to be compressed to identify any differences therebetween and the second stage is the compression of number of bits used to represent the runs of ones and zeros of the result of the comparison.

By using the method of the present invention in a screen sharing or collaborative working environment, a significant reduction in the amount screen data or bandwidth required to update the screens can be realized.

Having compressed an original data set it is desirable to be able to reconstruct the original data set from the compressed data.

Accordingly the present invention provides a method for decompressing a sequence of bits, said method comprising the steps of establishing an initial number of bits constituting a group thereof, reading groups of bits from said sequence until one of said groups comprises non-zero values, each group having progressively more bits than the preceding group, producing a run of bits according to the number of groups read and the value of the group comprising non-zero values, said bits having a value determined by the value of said first bit repeating said steps of establishing, reading and producing until all bits of said sequence have been decompressed.

BRIEF DESCRIPTION OF THE DRAWINGS

Embodiments of the present invention will now be described, by way of example only, with reference to the accompanying drawings in which:

FIG. 4 illustrate compression according to an embodiment; and

FIG. 5 illustrates decompression according to an embodiment.

DESCRIPTION OF THE PREFERRED EMBODIMENTS

Figure 1:
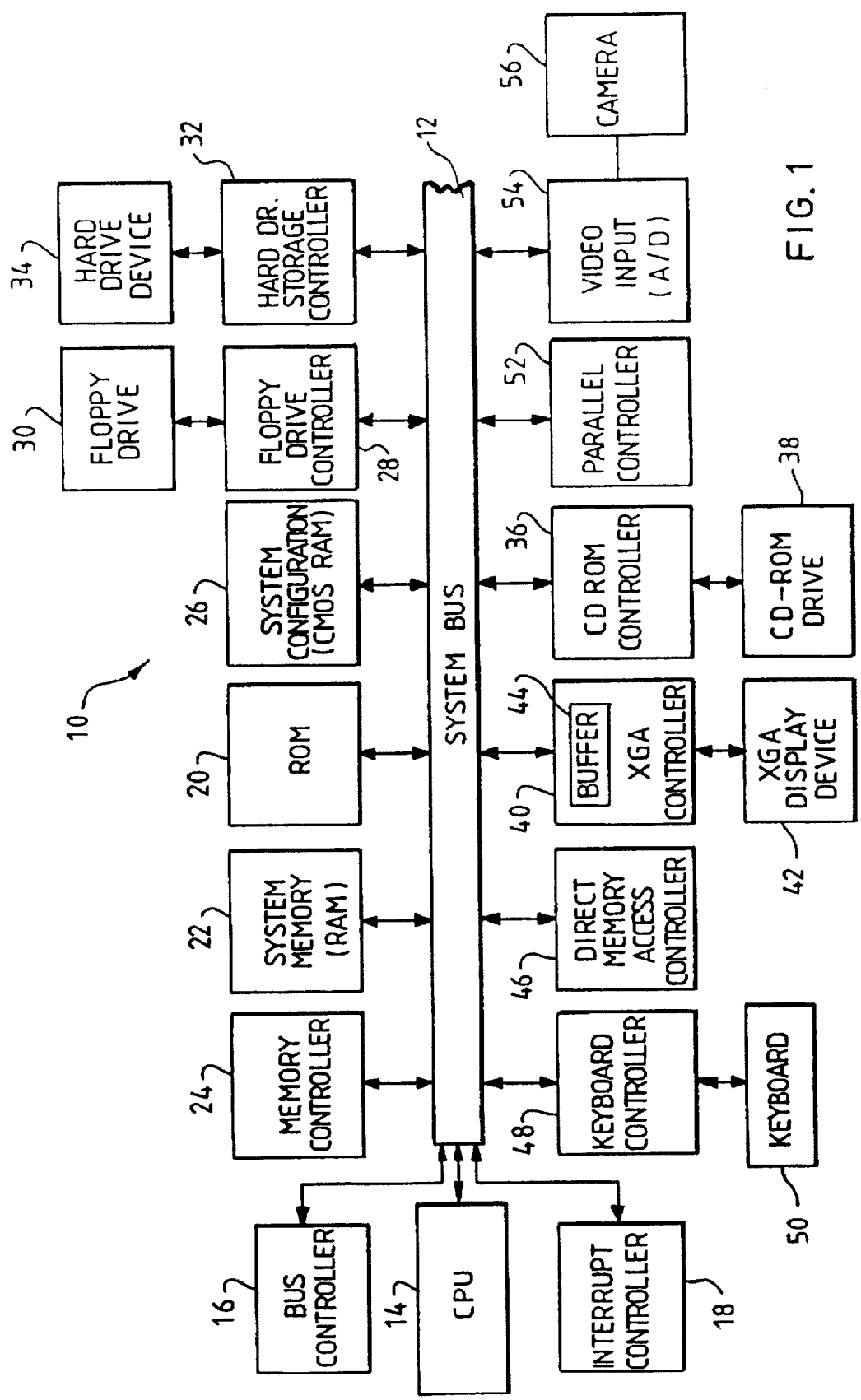
FIG. 1 is a high level block diagram of a data processing system utilized to realize an embodiment of the present invention.

Referring to FIG. 1, there is depicted a block diagram of a personal computer system 10, such as an IBM PS/2 personal computer. The computer system 10 includes a 16-bit wide system bus 12. Connected to system bus 12 is a central processing unit (CPU) 14, for example an Intel 486 or similar microprocessor. CPU 14 passes data to and receives data from other devices attached to system bus 12 over the system bus. Traffic on the bus is controlled by a bus controller 16. An interrupt controller 18 handles interrupts passed between CPU 14 and the remaining devices.

Read only memory (ROM) 20 is non-volatile memory storing power on test processes and a basic input/output system (BIOS or ROM-BIOS). The system memory 22 is random access memory into which an operating system, such as the IBM OS/2 operating system, programs and data can be loaded for execution or manipulation. Additional hardware components of computer 10 attached to system bus 12 include a memory controller 24 and a system configuration store 26, provided by random access memory (RAM).

Auxiliary data storage is provided by peripheral controllers and associated storage devices including, a floppy disk or diskette controller 28 and drive 30, a hard drive controller 32 and hard drive device 34, and a compact disk (CD) read only memory (ROM) controller 36 with CD-ROM drive 38. Digital video signals, compressed as described herein, may be supplied to computer system 10 from compressed video data stored on portable media mounted in CD-ROM drive 38. After decompression by CPU 14, visual reproduction of video segments is carried out using an extended graphics array (XGA) controller 40 and suitable display 42. The XGA controller 40 includes a RAM buffer 44 in which the current frame for display is stored. In some computers, the buffer 44 may be loaded directly from system memory 22 or from an auxiliary storage controller. In system 10, the CPU 14 handles both the compression and decompression of data.

Direct memory access (DMA) controller 46 handles data transfers between auxiliary storage devices or other input/output devices, and system memory 22 without interaction by CPU 14. Keyboard controller 48 provides an interface to a keyboard 50, for user entries, and may be used to provide an interface to a "mouse". Parallel controller 52 is a device controller for an input or output device (e.g. a printer connected to computer 10 by a parallel cable).

Video signals may be derived from a number of sources, including graphics generated by an application program executing on CPU 14 or from a video camera 56 and an associated video interface 54 as used in video conferencing or collaborative working systems. The video interface 54 converts an analogue video signal, such as NTSC or PAL, into a digital video signal. The digital signal comprises a series of frames each being an array of bits representing an image.

Figure 2:
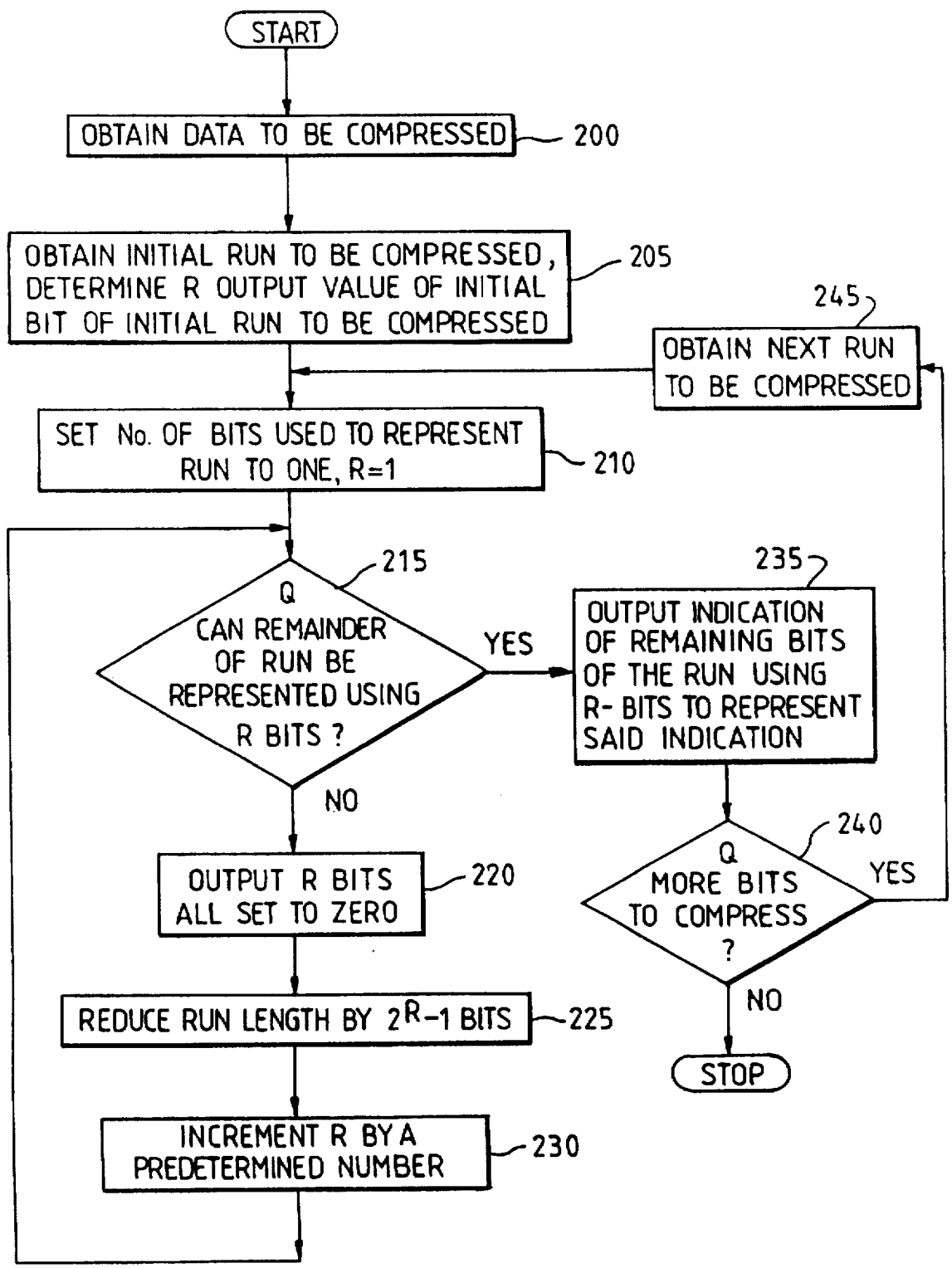
FIG. 2 depicts a flow diagram for compression of a sequence of bits according to an embodiment.

Referring to FIG. 2, there is shown a flow diagram for compressing data comprising a plurality of binary bits according to an embodiment. The data to be compressed is obtained at step 200. Step 205 obtains the initial run of the data to be compressed and determines the value of the first bit of that run. The value of that bit is also output for further processing at step 205. The number of bits, R, which are used to represent the length of the initial or current run is set to one at step 210. A determination is made at step 215 as to whether or not the remaining number of bits in the current run can be represented using R bits. If not, step 220 outputs R zero bits. The current run length is reduced by $2^R-1$ bits at step 225. The number of bits, R, used to represent the length of the current run is incremented by a predetermined number, PN, at step 230 and processing continues with step 215. In the present embodiment the predetermined number is two bits. Hence, R increases by two bits for every iteration of steps 215 to 230. If so, an indication of the number of bits constituting the remainder of the current run is output using R bits to represent that indication at step 235. A determination is made at step 240 as to whether or not there are more bits to compress. If so, step 245 obtains the next run to be compressed. If not, compression of the data is complete.

Although the embodiment described with reference to FIG. 2 outputs R zero bits at step 220, an alternative embodiment can be realized in which a running total of the number of bits to output is maintained and an appropriate number of zero bits can be also output at step 235.

Generally each run of bits is represented using a plurality of groups of bits; each groups in the plurality comprising progressively more bits than a preceding group and the final group in said plurality comprising at least one non-zero bit. Each group represents a certain number of bits of the run and the value of the group containing the non-zero bits represents the remainder of the number of bits constituting the run less the number of bits of the run represented by the other preceding groups.

Further, embodiments may be realized in which the increase in the number of bits, R, per iteration is some value other than the fixed two bits. Other values may be used according to, for example, the average length of the runs i.e. if long runs are anticipated then a very large initial increment could be employed. Still further, the scale of the increments could be made to vary in a predetermined but unequal manner that predetermined manner would have to be exactly the same for decompression.

Figure 3:
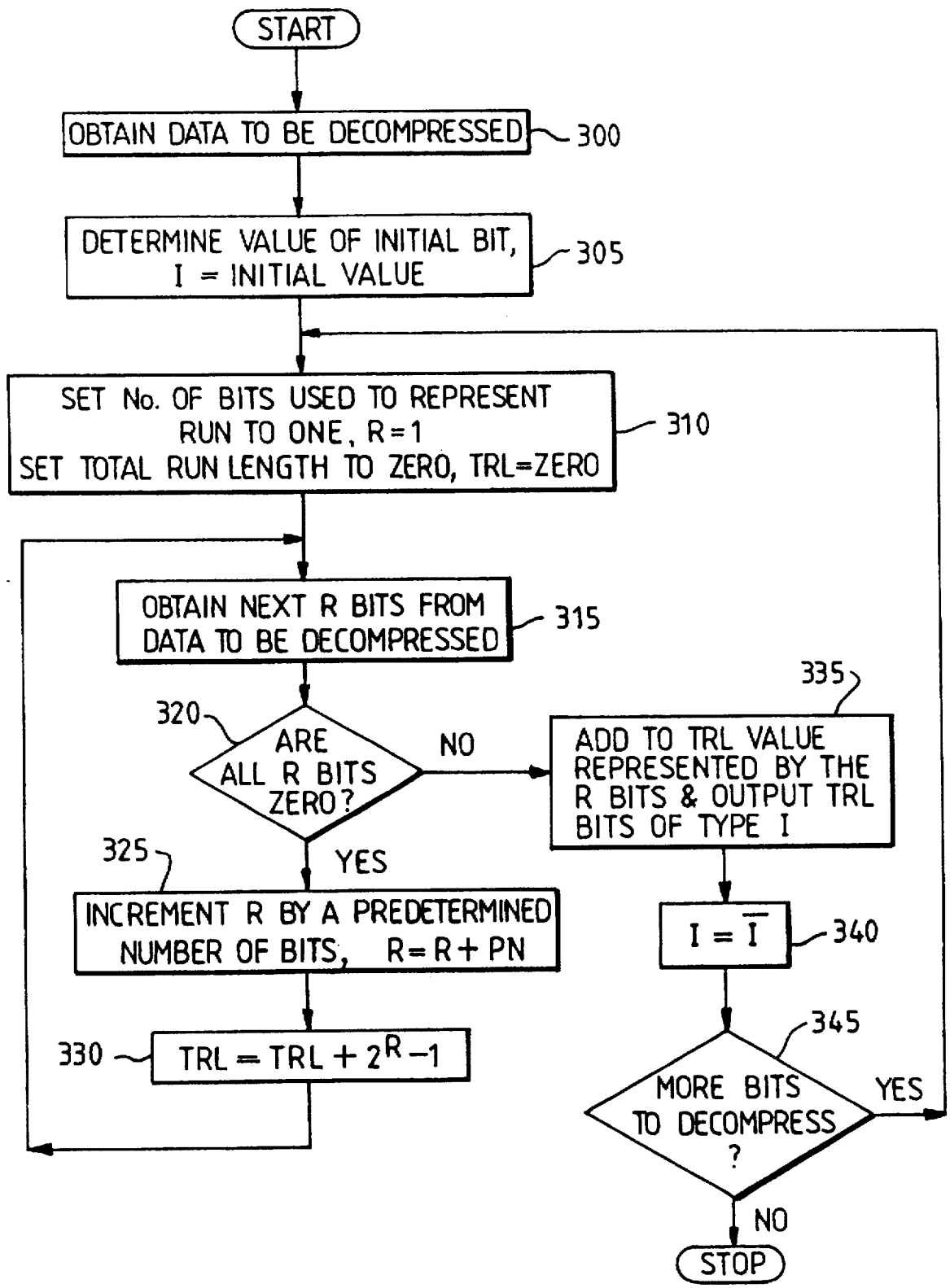
FIG. 3 depicts a flow diagram for decompression of a sequence of compressed bits according to an embodiment.

FIG. 3 illustrates a flow diagram for decompressing a sequence of binary bits which have been compressed in accordance with the embodiment depicted by FIG. 2. The data to be decompressed is obtained at step 300. Step 305 determines the initial value of the data to be decompressed. That value is stored in a variable, I. The number of bits, R, used to represent at least part of a current run is set to one and the total run length, TRL, of the current run being decompressed is set to zero at step 310. Step 315 obtains the next R bits from data to be decompressed. A determination is made at step 320 as to whether or not the value represented by the R bits is zero. If so, step 325 increments R by a predetermined number, PN. Step 330 calculates the total run length thus far by TRL=TRL+$2^R$-1 and then processing continues at step 315 where the next R bits are obtained from the data to be decompressed. If not, the binary value represented by the R bits is added to the total run length, TRL, and a run of TRL bits of type I is output at step 335. As a run of bits of type I has just been output the next run must be of type NOT (I). Hence the value of I is adjusted accordingly. A determination is made at step 345 as to whether or not there are further bits to be decompressed. If so, processing is continued at step 310. If not, the data to be decompressed has been so decompressed and decompression is complete.

Although the above embodiment keeps a running total of the number of bits constituting a current run before outputting a run of an appropriate length, an embodiment can be realized in which $2^R-1$ bits are output between step 320 and step 325 with step 335 merely outputting the number of bits of type I represented by the R bits.

Referring to FIG. 4 there is shown an example of the operation of the embodiment shown in FIG. 2. A sequence of binary bits 400 is compressed to produce a compressed sequence 405. The initial bit 402 of the sequence 400 to be compressed is a one. Hence a bit 404 having the same value as that initial bit 402 is output for further processing. It can be seen that the first 406 (or current) run comprises thirteen bits. The number thirteen cannot be represented using a single binary bit. Hence a zero bit 408 is output for further processing, the number of bits used to represent the length of the current run is increased by two bits to three and the current run 406 is reduced by one bit thereby leaving twelve bits 410 to be represented using the three bits. The maximum number of bits which can be represented using three bits is seven. Again it can be seen that the remaining twelve bits 410 cannot be represented using only three bits. Hence three binary zeros 412 are output for further processing, the number of bits used to represent the remainder of the current run is increased by two bits to five bits and the current run is reduced by seven bits thereby leaving five bits 414 in the current run. The maximum number of bits which can be represented using five bits is thirty-one. Hence the remaining five bits 414 of the run can be represent using five bits. Hence the number five 416 as represented using five bits is output for further processing thereby completing compression of the current run 406. The embodiment described compressed thirteen ones down to the following sequence: 1000000101.

The next run 418 for compression is obtained. The next run 418 comprises seven zeros. It is clear that seven zeros cannot be represented using a single bit. Accordingly, a zero 420 is output for further processing, the number of bits constituting the run is reduced by one and the number of bits used to represented the remainder of the run is increased by two bits to three. The remaining six bits 422 can be represented using three bits. Therefore the following bits 424 are output for further processing: 110. The run 0000000 has been compressed to the sequence 0110.

The next run 426 for compression is obtained. The run 426 comprises four ones which cannot be represented using a single bit. Therefore, a single binary zero 428 is output, the run length is reduced by one and the number of bits used to represent the remainder of the run is increase by two bits to three. It can be seen that the three remaining bits 430 can be represented using three bits. Hence the following sequence 432 is output for further processing: 011.

The next run 434 for compression is obtained. The single zero constituting the next run 434 can be represented using a single bit and therefore a single one 436 is output for further processing. Similarly, a single binary one 438 is output for the following run 440 comprising a single binary one.

The final run 442 comprising five zeros is obtained. The five zeros cannot be represented using a single bit and therefore a single zero bit 444 is output for further processing, the number of bits used to represent the remaining bits 446 of the run are increased by two bits and the run length is reduced by one. The remaining four bits 446 can be represented using three bits. Hence the following sequence 448 is output for further processing: 100.

Decompression is the reverse of compression. Referring to FIG. 5 there is illustrated decompression of a compressed sequence 500. The first bit 502 of the compressed sequence 500 is determined and stored. Next the following single bit 504 is obtained. The obtained bit 504 is tested to determined whether or not it is zero. If so, the current run 506 when compressed was too long to be represented using a single bit. Hence a single binary one 508 is output and the next three bits 510 of the compressed sequence 500 are obtained. Again the obtained bits 510 are tested to determined whether or not they are zeros. As they are zeros the remainder of the run 506 when compressed was too long to represent using only three bits. Hence seven ones 512 are output for further processing and the next five bits 514 of the compressed data 500 are obtained. It can be seen that the next five bits 514 are not zero and in fact represent the number five. Hence a series of five ones 516 are output for further processing and the stored bit 502 is inverted to become a zero. The inversion or toggling of the stored bit 502 is repeated every time a non-zero series of bits are encountered in the compressed sequence. Hence the first run 506 of the compressed data 500 has been determined.

The next single bit 518 is obtained from the compressed data 500. As that bit 518 is a zero, it is evident that the run 520 to be compressed constituted more than a single bit. Hence a single binary zero 522 is output for further processing and the next three bits 524 are obtained. It can be see that the next three bits 524 represent the number six i.e. they are non-zero. Hence six zeros 526 are output for further processing and the type, I, of bits to be output for the next decompressed run is changed i.e. changed to a one.

As a non-zero series of bits have just been encountered, the next single bit 528 is obtained from the compressed data 530. That bit 528 is a zero, hence it is clear that the run 532 of the uncompressed data from which it was derived comprised more than a single bit. Hence a single binary one 534 is output and the next three bits 536 are obtained from the data 500 to be decompressed. It can be seen that the next three bits 536 represent a value other than zero i.e. the value three. Therefore three ones 538 are output, the next single bit 540 is obtained from the compressed data 500 and the type, I, of the output bits are inverted.

As the value of the single obtained bit 540 is non-zero a single binary zero 542 is output, the next bit 544 is obtained from the compressed data 500 and the value of the output bits are inverted. Therefore a single binary one 546 is output and the output bits are inverted.

The next single bit 548 is obtained from the compressed sequence 500. Again, as that single bit 548 is a zero, a single zero 550 is output and the next three bits 552 are obtained from the compressed data 500. Those three bits 552 represent a non-zero value i.e. the value four and therefore four binary zeros 554 are output. Since there is no more data to be decompressed, decompression is completed and the sequence 10000001010100011110100 has been decompressed to 1111111111111000000011110100000.

We claim:

1. A method for compressing a sequence of bits having runs of ones and runs of zeros, said method comprising the steps of:

outputting the value of the first bit of said sequence, the first bit of the sequence identifying whether the first run of the sequence is a run of bits each having a one value or a run of bits each having a zero value, each successive run of the sequence being a run of bits each having a value opposite to the value of the bits in the run that immediately precedes it; determining an initial length of a run and setting a value of an indicator to a predetermined initial value, a current value of said indicator representing a number of bits;

repeatedly determining whether or not a current length of said run can be represented using the number of bits represented by the current value of said indicator, and if not, outputting a string of zero value bits equal in number to the number of bits represented by the current value of the indicator, reducing the current length of said run by the maximum number of bits which can be represented using the number of bits represented by the current value of the indicator and increasing said current value of the indicator; and in response to a determination that the current length of said run can be represented using the number of bits represented by the current value of said indicator, outputting a group of bits equal in number to the number of bits represented by the current value of the indicator, said group of bits together having a value representing the number of bits in the current length of said run.

2. A method as claimed in claim 1, wherein said increasing said current value of the indicator increases said current value of said indicator by a fixed number.

3. A method as claimed in claim 2, wherein said fixed number is two.

4. A method as claimed in claim 1, wherein if R represents said current value of said indicator, the number of bits in the current length of said run which can be represented is $2^R-1$.

5. A method for decompressing a sequence of bits, said method comprising the steps of establishing an initial number of bits constituting a group thereof, reading groups of bits from said sequence until one of said groups comprises at least one bit having a non-zero value, each group having progressively more bits than the preceding group, producing a run of bits according to the number of groups read and the value of the group comprising at least one bit having a non-zero value, said bits all having a value determined by the value of said first bit, repeating said steps of establishing, reading and producing until all bits of said sequence have been decompressed.

6. A system for compressing a sequence of bits having runs of ones and runs of zeros, said system comprising:

means for outputting the value of the first bit of said sequence, the first bit of the sequence identifying whether the first run of the sequence is a run of bits each having a one value or a run of bits each having a zero value, each successive run of the sequence being a run of bits each having a value opposite to the value of the bits in the run that immediately precedes it;

means for determining an initial length of a run and for setting a value of an indicator to a predetermined initial value, a current value of said indicator representing a number of bits;

means for repeatedly determining whether or not a current length of said run can be represented using the number of bits represented by the current value of said indicator, and if not, for outputting a string of zero value bits equal in number to the number of bits represented by the current value of the indicator, and for reducing the current length of said run by the maximum number of bits which can be represented using the number of bits represented by the current value of the indicator and for increasing said current value of the indicator; and means, responsive to a determination that the current length of said run can be represented using the number of bits represented by the current value of said indicator, for outputting a group of bits equal in number to the number of bits represented by the current value of the indicator, said group of bits together having a value representing the number of bits in the current length of said run.

7. A system as claimed in claim 6, wherein said means for increasing said current value of said indicator increases said current value of said indicator by a fixed number.

8. A system as claimed in claim 7, wherein said fixed number is two.

9. A system as claimed in claim 6, wherein if R represents said current value of said indicator, the number of bits in the current length of said run which can be represented is $2^R-1$.

10. A system for decompressing a sequence of bits, said system comprising means for establishing an initial number of bits constituting a group thereof, means for reading groups of bits from said sequence until one of said groups comprises at least one bit having a non-zero value, each group having progressively more bits than the preceding group, means for producing a run of bits according to the number of groups read and the value of the group comprising at least one bit having a non-zero value, said bits all having a value determined by the value of said first bit, means for repeating said steps of establishing, reading and producing until all bits of said sequence have been decompressed.

* * * * *